United States Patent
Osborn et al.

(10) Patent No.: US 6,878,874 B2
(45) Date of Patent: Apr. 12, 2005

(54) ELECTRONICS ASSEMBLY

(75) Inventors: Jay Kevin Osborn, Crowthorne (GB); Frazer Ely, Reading (GB)

(73) Assignee: Sun Microsystems, Inc., Santa Clara, CA (US)

( * ) Notice: Subject to any disclaimer, the term of this patent is extended or adjusted under 35 U.S.C. 154(b) by 49 days.

(21) Appl. No.: 10/166,517

(22) Filed: Jun. 10, 2002

(65) Prior Publication Data

US 2003/0226675 A1 Dec. 11, 2003

(51) Int. Cl.[7] .............................. H05K 5/00; H05K 7/20
(52) U.S. Cl. .................... 174/50; 174/17 VA; 361/687; 361/694; 361/695; 454/184
(58) Field of Search ...................... 174/50, 17 VA, 174/16.1; 220/3.2, 4.02; 361/687, 694, 695, 724, 725, 726, 727, 796; 454/184, 228, 237; 312/326

(56) References Cited

U.S. PATENT DOCUMENTS

| | | | |
|---|---|---|---|
| 5,562,410 A | * | 10/1996 | Sachs et al. ............... 361/695 |
| 5,663,868 A | * | 9/1997 | Stalley ...................... 361/695 |
| 5,788,467 A | * | 8/1998 | Zenitani et al. ............. 361/694 |
| 5,886,639 A | * | 3/1999 | Behl et al. .................. 361/695 |
| 6,075,698 A | * | 6/2000 | Hogan et al. ............... 174/16.1 |
| 6,115,250 A | * | 9/2000 | Schmitt ..................... 361/687 |
| 6,141,211 A | * | 10/2000 | Strickler et al. ............ 361/727 |
| 6,327,144 B1 | | 12/2001 | May |
| 6,373,698 B1 | * | 4/2002 | Christensen ............... 174/16.1 |
| 6,414,845 B2 | * | 7/2002 | Bonet ........................ 361/695 |
| 6,473,297 B1 | * | 10/2002 | Behl et al. .................. 361/727 |
| 6,522,539 B2 | * | 2/2003 | Ota et al. ................... 361/695 |
| 6,556,437 B1 | * | 4/2003 | Hardin ....................... 361/687 |
| 6,572,207 B2 | | 6/2003 | Hase et al. |
| 6,594,148 B1 | * | 7/2003 | Nguyen et al. ............. 361/695 |
| 2004/0032722 A1 | * | 2/2004 | Wrycraft et al. |

FOREIGN PATENT DOCUMENTS

| | | |
|---|---|---|
| EP | 1198867 | 3/2004 |
| GB | 2211360 | 6/1989 |
| JP | 05-021973 | 1/1993 |
| JP | 2000-151137 | 5/2000 |
| JP | 2002-145267 | 5/2002 |
| JP | 2002-145269 | 5/2002 |
| WO | 99/60834 | 11/1999 |

OTHER PUBLICATIONS

"Pluggable Fan Assembly", IBM Corp., IBM Technical Disclosure Bulletin, vol. 32, No. 3A, Aug. 1989.
"Fan/Board Mounting Bracket", IBM Corp., IBM Technical Disclosure Bulleting, vol. 38, No. 06A, Jun. 1993.

* cited by examiner

Primary Examiner—Dean A. Reichard
Assistant Examiner—Angel R. Estrada
(74) Attorney, Agent, or Firm—Meyertons Hood Kivlin Kowert & Goetzel, P.C.; B. Noël Kivlin

(57) ABSTRACT

A chassis for an electronic system. The chassis includes a recess therein for housing a plurality of cooling fans that are arranged in series and can be removed from the recess by sliding out of the recess in a direction across the direction of intended airflow. The assembly is arranged such that any of the fans can be removed and replaced without interrupting operation of the or any other fan. The recess and/or the fans have a seal to prevent or reduce bypass leakage of air around the fans.

15 Claims, 5 Drawing Sheets

ELECTRONICS ASSEMBLY

BACKGROUND OF THE INVENTION

The present invention relates to electronics assemblies, and is primarily concerned with thermal management therein. Many such assemblies will be located in racks for housing in for example nineteen inch cabinets, or other size cabinets, in cabinets such as twenty three inch or metric cabinets. The assemblies may for instance be employed as servers for a number of systems, for example in local area networks (LANs), wide area networks (WANs), telecommunications systems or other operations such as database management or as internet servers.

Such an assembly will typically comprise a supporting chassis that houses a motherboard or backplane and a number of daughterboards or module cards that extend in planes generally perpendicular to the plane of the motherboard. Because of the amount of heat that is generated during operation of the equipment and the thermal sensitivity of the equipment, it is necessary to provide cooling fans in order to direct a current of air through the assembly or otherwise permanent damage would occur.

One form of assembly includes so-called "RAS computers" that is to say, computers that need to provide a high degree of reliability, availability and serviceability, and which therefore need to maximise the length of time during which the computer is operational. If a computer cannot run with a failed fan, its reliability is compromised, and if it must be shut down to replace the fan, the availability (uptime) of the system will be compromised. The fan serviceability, including typical time to replace and special tool requirements can also contribute to the system availability by affecting the probability of repair success.

SUMMARY OF THE INVENTION

According to one aspect, the present invention provides an electronics assembly which comprises a chassis having a recess therein for housing a plurality of cooling fans that are arranged in series and can be removed from the recess by sliding out of the recess in a direction across the direction of intended airflow, wherein any of the fans can be removed and replaced without interrupting operation of the or any other fan, and the recess and/or the fans have a seal to prevent or reduce bypass leakage of air around the fans.

The cooling fans will normally be in the form of modules in which the fans are housed in a body, for example a generally rectangular body, and are arranged in the recess in series, that is to say, so that the air flows sequentially through all fans of the plurality. This arrangement provides a degree of redundancy, so that should one fan fail, an airflow will still be provided by the other fan. Usually, the assembly will register the failure of one of the fans and send a signal to a central control, so that a service engineer can be despatched to repair the assembly. The service engineer can then simply disconnect the failed fan, remove it and replace it with another fan, without shutting the system down at any time.

In one embodiment of the invention the chassis and/or cooling fans are configured such that the fans are not held in the recess by any fastener and/or do not require any tool for their removal from the chassis. Such an embodiment has the advantage that the speed of change of the fans can be increased.

A seal will need to be provided between the body of the fan modules and the recess in the chassis in order to prevent, or at least reduce, bypass leakage of air around the fans and therefore to maximise the airflow through the equipment. This may be achieved in any of a number of ways, for example by providing a gasket that extends around the fan and/or the recess. Such a gasket may extend around an edge region of the fan module that will be in contact with side surfaces of the recess when the fans are in operation, or it may extend along a face of the fan module in a peripheral region thereof. The gaskets may be formed from any appropriate material, for example a textile felt, from plastics or rubber, or from metal. In one form of assembly, one of the recess and the fans has a ridge that extends around at least a major part of the surface thereof that contacts the other of the recess and the fans, and the other of the recess and the fans has, extending around at least a major part of the corresponding surface thereof, a groove that receives the ridge to form at least part of the seal. In this case, the engagement of the ridge within the groove can provide a way of ensuring correct positioning of the fan within the recess. The seal formed by engagement of the ridge and the groove will not be completely airtight, but it will normally provide sufficient resistance to bypass leakage of air to ensure adequate cooling of the equipment by the fan.

Although the ridge and groove may be located in either the fan or recess, it is convenient for the ridge to be located on the fan and the groove to be in the recess. The ridge may, for example, be formed by the peripheral edge of a sheet that is attached to one face of the or each fan, and the groove to be formed in a block of plastics or other material that is arranged to extend around the interior of the recess and provide seating for the fan.

It is not necessary for the seal to be formed in the same way around the entire periphery of the fan and recess, and indeed, there are advantages in forming it in different ways on different parts of the fan. In particular, because the fan will be inserted into, and removed from, the recess from one side thereof, it may be appropriate to form the seal differently along that side from which the fan is removed. Thus, according to one embodiment, where the seal is formed from a ridge and groove, they may extend around three sides of the fan, and especially around the sides of the fan and recess other than the side from which the fan is removed from the recess. Also, where a ridge and groove seal is employed along three sides of the fan, the seal may not be exactly the same along all sides. For example, the groove may be wider at the bottom surface of the fan or recess in order to reduce the danger of misalignment of the bottom ridge with its corresponding groove. It is possible to employ a wider groove at the bottom edge because the bottom edge of the fan will be kept in contact with the bottom surface of the recess due to gravity, and so provide a seal.

Another form of seal that may be used in addition to or instead of a ridge and groove, is an elongate protuberance. Thus, one of the recess and the fans may have a protuberance that extends along at least part of the region thereof that contacts the other of the recess and the fans and which forms part of the seal. The protuberance may, for instance, be located on the fan and usually on a major face of the fan. The protuberance will thus contact either the end face of the recess or another fan, depending on the position of the fan in the assembly. In one embodiment of the invention, each fan has a seal that is formed by a ridge that extends along three of four sides thereof, and a protuberance that extends over a major surface thereof in the region of the fourth side. Each fan will form a seal over three sides of the recess by means of the ridge and groove, and over the fourth side by means of the protuberance that bears on either the end surface of the recess or the opposite surface of the adjacent fan.

Each fan may include an element that can be grasped by a finger or hand of the service engineer in order to remove it easily and quickly. For example, the element may be formed as a loop extending from one major surface of the fan to the other at the peripheral edge of the fan that is first removed. Such a fan can easily be made by attaching a sheet, for example a sheet of metal, to each side of the fan. If the sheets are joined to one another by means of a strip of the material forming the sheets, then folding of the sheet onto opposite sides of the fan will form a loop that can be grasped by the service engineer to enable the fan to be removed easily and quickly.

Some system should, however, be provided to ensure that no injury can be sustained by touching a moving fan blade when a fan is removed. This may be achieved, for example, by providing a guard on the major surfaces of the fan, but this has the disadvantage that the fans will be bulkier than necessary. In addition such finger guards can significantly impede air flow through the fan. An alternative solution is to provide an electrical connector that can be connected to a corresponding connector on the chassis for providing power, and to ensure that the fan cannot be removed from the recess without disconnecting the connectors. This could, for instance, be achieved by positioning one of the connectors so that is physically blocks removal of the fan from the recess. Another way of achieving this is to connect the connector to the fan by means of wires that extend in front of the leading edge region of the fan (in the direction of removal) so that the fan cannot be removed sufficiently to expose the fan blades without disconnecting the connectors.

This form of fan is novel per se and so, according to another aspect, the invention provides a cooling fan module for an electronics assembly, which has a generally flat body and has, extending around a peripheral region thereof, a seal to prevent or reduce bypass leakage of air around the fan during operation, the fan having an electrical connector that is attached thereto by means of wires that extend along one edge region of the fan and prevent removal of the fan from the assembly without disconnecting the electrical connector.

According to another aspect, the invention provides a cooling fan module for an electronics assembly, which has a generally flat body and has, one each face thereof a sheet of material, the sheets being connected to one another by a web of the material that extends around one edge region of the module in the form of a loop that allows the module to be manually grasped and removed from, or inserted into, the assembly.

According to yet another aspect, the invention provides a chassis for an electronics assembly, which chassis has a recess therein for housing a plurality of cooling fans that can be inserted into the recess in a direction across the direction of intended airflow and arranged in the recess in series, wherein the chassis allows removed and replacement of any of the fans without interrupting operation of the or any other fan, and the recess has a seal to prevent or reduce bypass leakage of air around the fans.

According to yet another aspect, the invention provides a method of replacing one of a plurality of cooling fans that are arranged in series in an electronics assembly, which comprises disconnecting the fan from a source of electrical power, sliding the fan out of the assembly, sliding a replacement fan into the assembly and connecting it to the source of electrical power, the operations being performed while the assembly is in operation and the or each other fan of the plurality of fans is under power.

BRIEF DESCRIPTION OF THE DRAWINGS

Embodiments of the present invention will now be described in detail by way of example with reference to the accompanying drawings, in which corresponding parts are given like reference numbers. In the drawings.

DESCRIPTION OF PARTICULAR EMBODIMENTS

Figure 1:
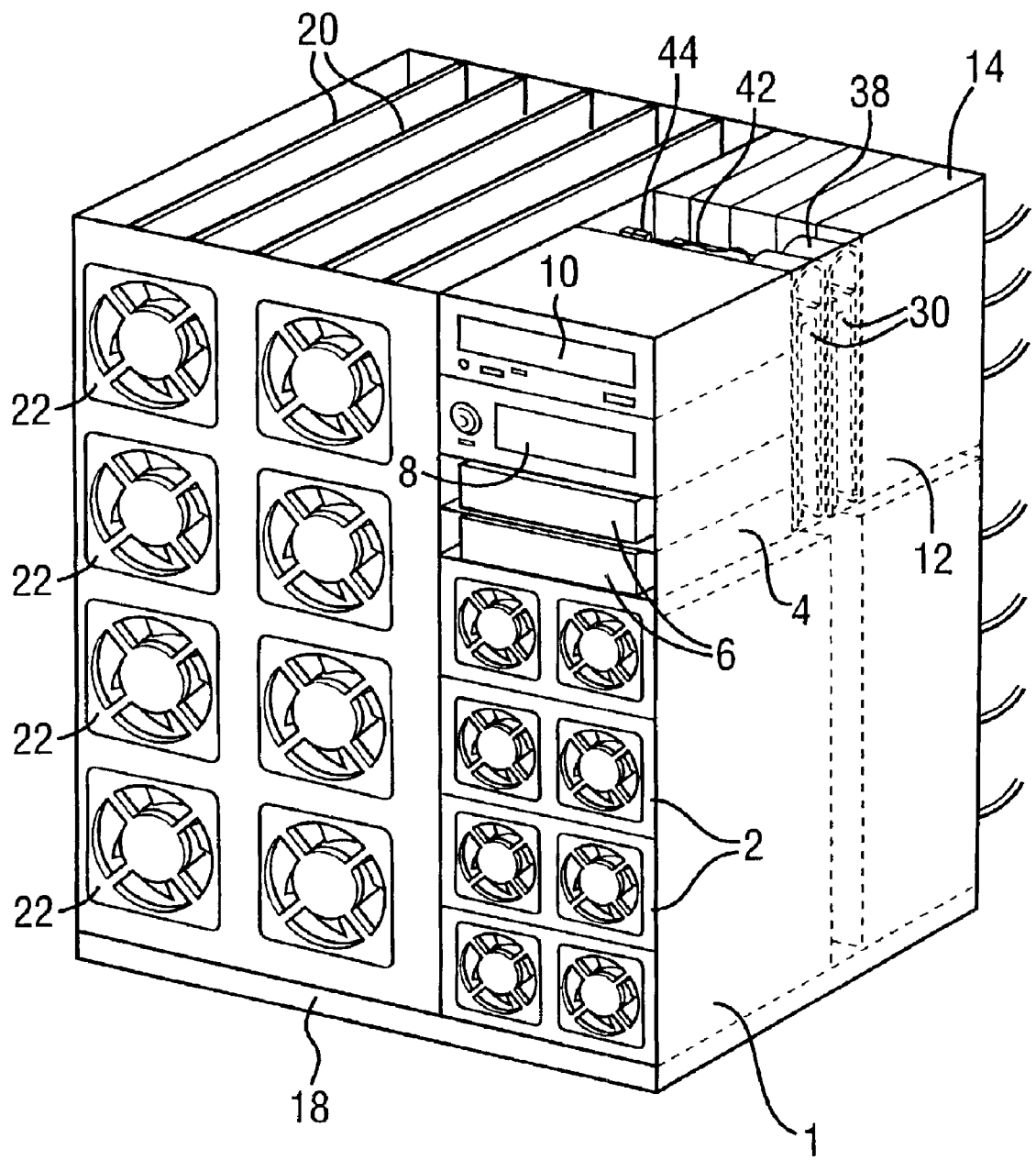
FIG. 1 is a schematic perspective view of an assembly according to the present invention.
Figure 1A:
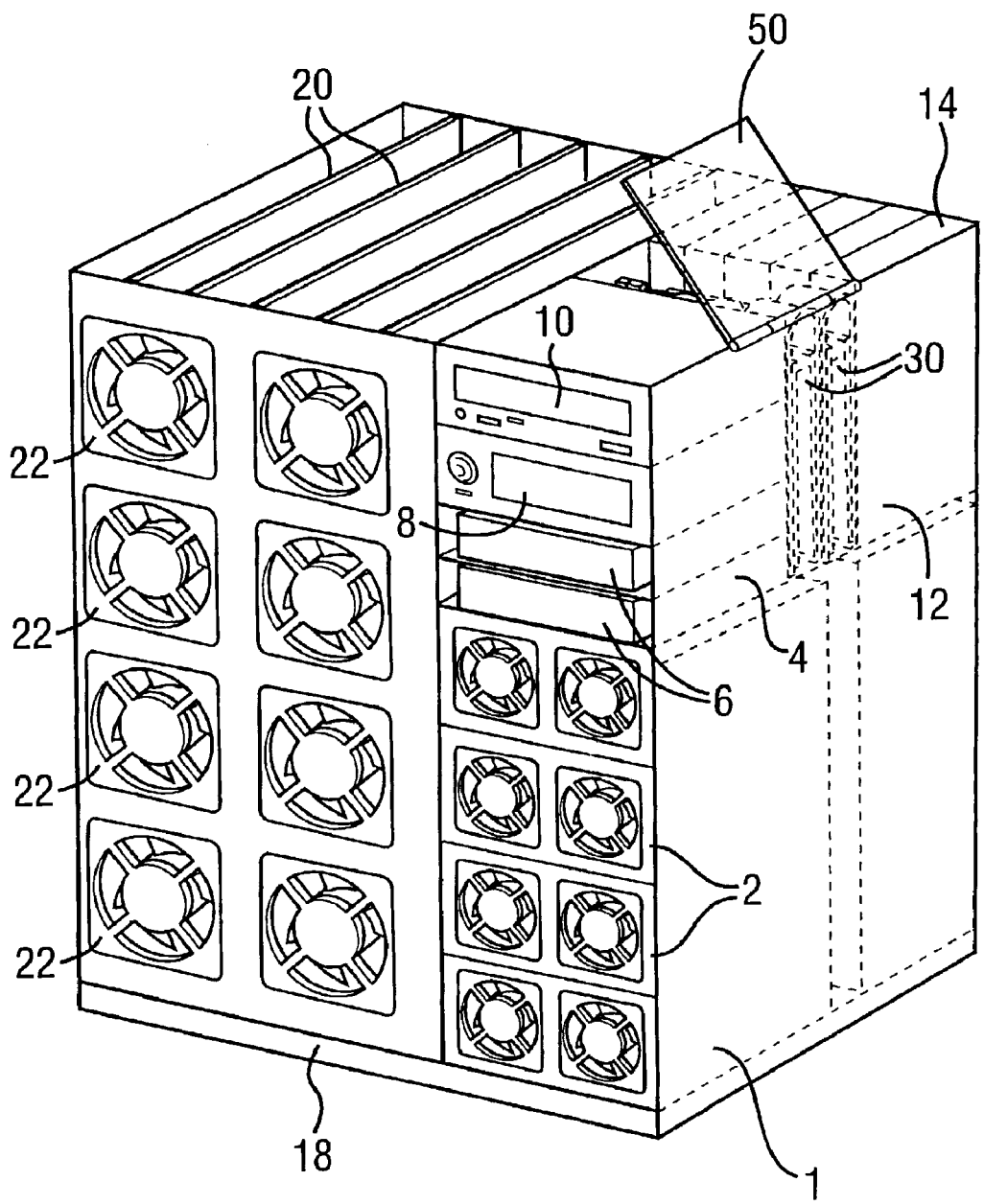

Referring now to the drawings, in which like reference numerals are used to designate corresponding elements, FIG. 1 shows an assembly according to one embodiment of the invention that forms part of a server that may be employed for a number of services, for example as part of a local area network (LAN) or for other telecommunications purposes, and is designed to fit into, for example, a nineteen inch rack electronics cabinet. Other sizes may alternatively be employed, for example to fit into 23 inch or metric racks. The assembly may be designed to be a so-called "RAS" system, that is to say, to have high reliability, availability and serviceability. As such, it is intended that the system will operated with the minimum amount of down time, and so a degree of redundancy is incorporated so that the system will continue to operate even when certain components have failed. In addition, servicing of the equipment should take as short a time as possible, and, where practical, components can be replaced without switching the system off.

The assembly comprises a chassis 1 in which the various components are located. The chassis contains a number of power modules 2 for converting mains a.c. power or d.c. supply to an appropriate d.c. voltage, a media area 4 that contains hard disc drives 6, a tape drive 8 and a CD-ROM or digital video disc drive or digital versatile disc (DVD) drive 10, and a part 12 that contains a number of input/output (I/O) cards 14. A motherboard is located within the chassis in a horizontal plane at the bottom of the chassis in a tray-shaped holder 18, and a number of daughterboards 20 are arranged next to each other in a vertical plane above the motherboard and to the side of the power modules 2. The daughterboards may serve any of a number of purposes, for example having CPUs or may be repeater boards etc. Also a number of fans 22 are provided in an array at the front of the chassis in order to blow air through the assembly between the daughterboards 20 for cooling.

The chassis 1 has a further recess that is located in the upper part thereof between the media area 4 and the part 12 containing the I/O cards 14 that contains two further cooling fans 30 for cooling the components in the media area 4 and the I/O cards 14. The recess is in the form of a short length of duct that is walled off from the remaining internal volumes of the chassis for example by means of perforated panels 16 and 17 so that it effectively functions externally to the system, that is to say, it is sealed against EMI emissions and the internal volumes are protected against ESD. The cooling fans 30 are arranged in series so that cooling air passes through both fans in series in order to provide a degree of redundancy. Should one fan 30 malfunction, cooling air will continue to be provided by the other fan until the malfunctioning fan is replaced.

Figure 3:
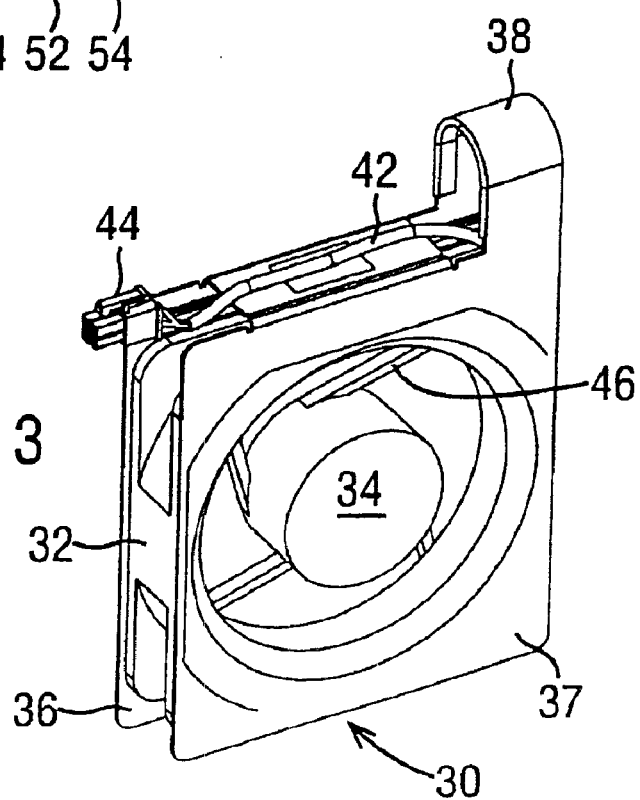
FIG. 3 is a perspective view of one of the fans employed in the assembly.
Figure 4A:
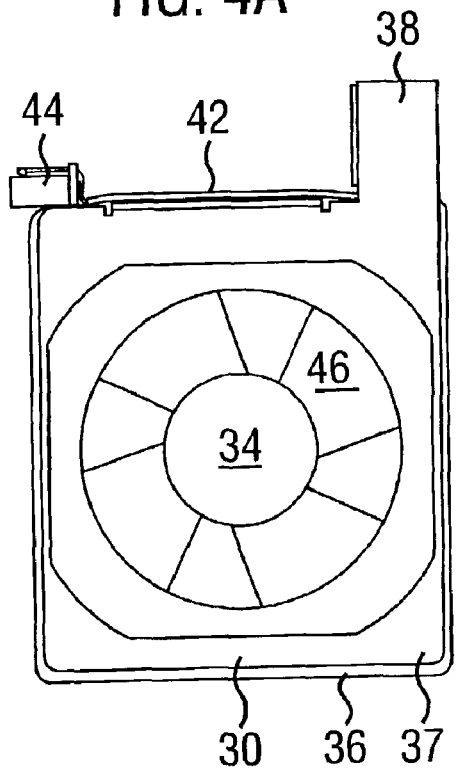
FIG. 4 is a view of the fan shown in FIG. 3 taken from the other side.
Figure 4B:
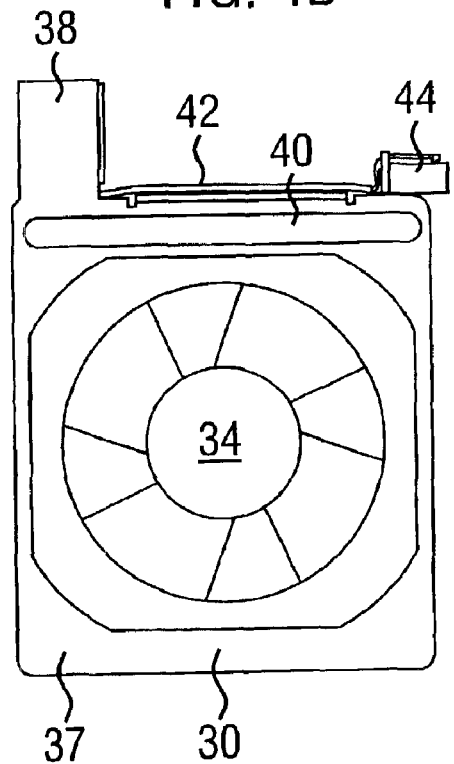

One fan module 30 is shown in FIGS. 3 and 4. The fan module comprises a generally flat fan unit 32 of substantially square major surfaces, which includes a fan 34 that is powered by a brushless d.c. motor, and blows air in a direction normal to the major surfaces. The fan module includes a sheet 36, 37 formed for example from similar material as that of the chassis, e.g. 1.0, 1.2 or 1.5 mm thick zinc plated or aluminium zinc plated steel that is attached to each major surface of the fan unit, each sheet having a central aperture therein to allow air to pass through. The central aperture is sufficiently large that each sheet 36 is little more than a generally square shaped perimeter of the aperture. The two sheets 36 and 37 are formed from a single piece of steel, and are joined by a relatively thin web that is bent into a substantially "U"-shaped loop 38 at one corner of the fan module that allows a service engineer to grasp the fan module by means of a finger. The provision of a loop or other element for holding the fan module encourages the fan module to be held at a location removed from the fan blades which provides additional protection. One sheet 36 is slightly larger than the other sheet 37 so that it extends in a lateral direction by about 4 mm more than the other sheet along three sides of the square. The larger sheet 36 also has an elongate protuberance 40 that extends along substantially the entire length of the remaining side of the square which is also the side on which the loop 38 is located.

Power for the fan 34 is provided by means of wires 42 that extend along the edge of the fan unit on the side of the square that has the protuberance 40 and the loop 38, from a connector 44 to the loop 38 and from there to the fan motor via one of the struts 46. The length of the wires 42 is only slightly longer than the length of the side of the fan module 30 so that power can be supplied to the fan only when the fan module is in place.

Figure 2:
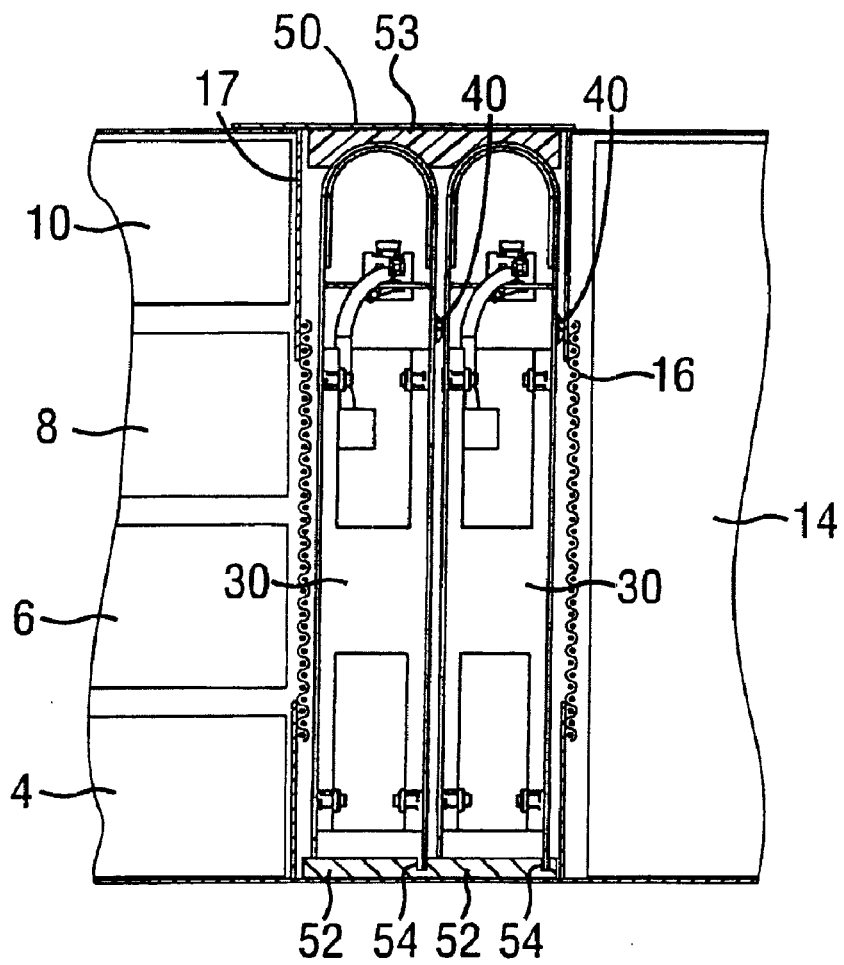
FIG. 2 is a schematic section through part of the assembly shown in FIG. 1 showing two cooling fans.

FIG. 2 shows two fan modules placed in position within the recess for cooling the media area 4 and the I/O cards 14. The chassis is provided with an access panel or door 50 which can be opened to reveal the recess and to allow insertion of the fan modules therein from the top side of the recess. The recess has plastics surfaces 52 extending along the sides thereof other than the side through which the fan modules are inserted, and each surface has a groove 54 extending along it for receiving the peripheral edge of the sheet 36 of each fan module 30 so that together they will form a seal against bypass leakage of air. A seal can be formed in this manner over three sides of the recess and fan modules, but it is inconvenient to form such a seal along the top side thereof. Along this side, a seal is formed by means of the elongate protuberance 40 on each fan module. The protuberance on the fan module 30 that is located closest to the I/O cards is in contact along its length with a flat, vertical end surface of the recess to form a seal, while the protuberance on the adjacent fan module that is located farther from the I/O cards is in contact along its length with the opposite surface of the other fan module. In this way, a seal is formed around the entire periphery of each fan. One or more volumes of foam 53 or other resiliently deformable material may be provided on the underside of the access panel 50 to bear on the loops 38 and urge the fan modules against the surfaces 52.

In operation, if one of the fan modules malfunctions, cooling air will be provided by the remaining functioning fan module, and the assembly will send a signal to a central service point to call out a service engineer to replace one of the fans. In order to replace the fan, the service engineer will open the access panel 50 and check which fan module 30 has malfunctioned, usually by viewing an LED on a panel in the recess or elsewhere, disconnect the fan module 30, remove it by pulling the loop 38, slide in a new fan module 30, and connect the power supply. The service operation can be performed in less than one minute without the need for tools, and no disruption occurs to the service provided by the assembly at any time between failure of the fan and completion of the service operation.

The access panel 50 may be closed after removal of the faulty fan module and so maintain duct pressures as in normal operation. This feature may be used to reduce the fan performance requirements in the service mode, or it may be eliminated to prevent the possibility of system failure if a service engineer forgets to close the access panel. In such a case a protuberance (not shown) corresponding to the protuberances 40 on the fan modules may be provided on panel 17 to provide a seal against the exterior of the assembly.

Figure 5:
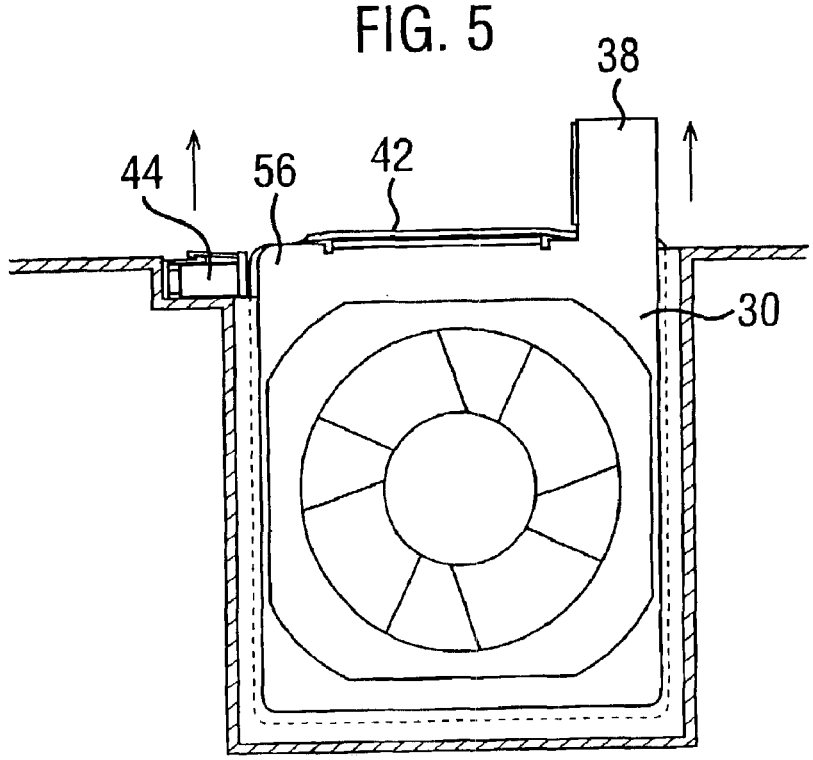
FIG. 5 is a view showing attempted removal of a fan while still connected.

In order to prevent the risk of injury by inadvertently removing a fan module which is operating, the wires 42 that supply power to the fan are only slightly longer than the length of one side of the fan module and extend along the leading edge of the module in the direction of removal of the module from the recess. Accordingly, if an attempt is made to remove one of the fan modules 30 during operation, as shown in FIG. 5, it can be removed only by a few millimetres before the wires contact the top edge of the fan module in the corner 56 adjacent to the connector 44, and so prevent further removal.

Figure 6:
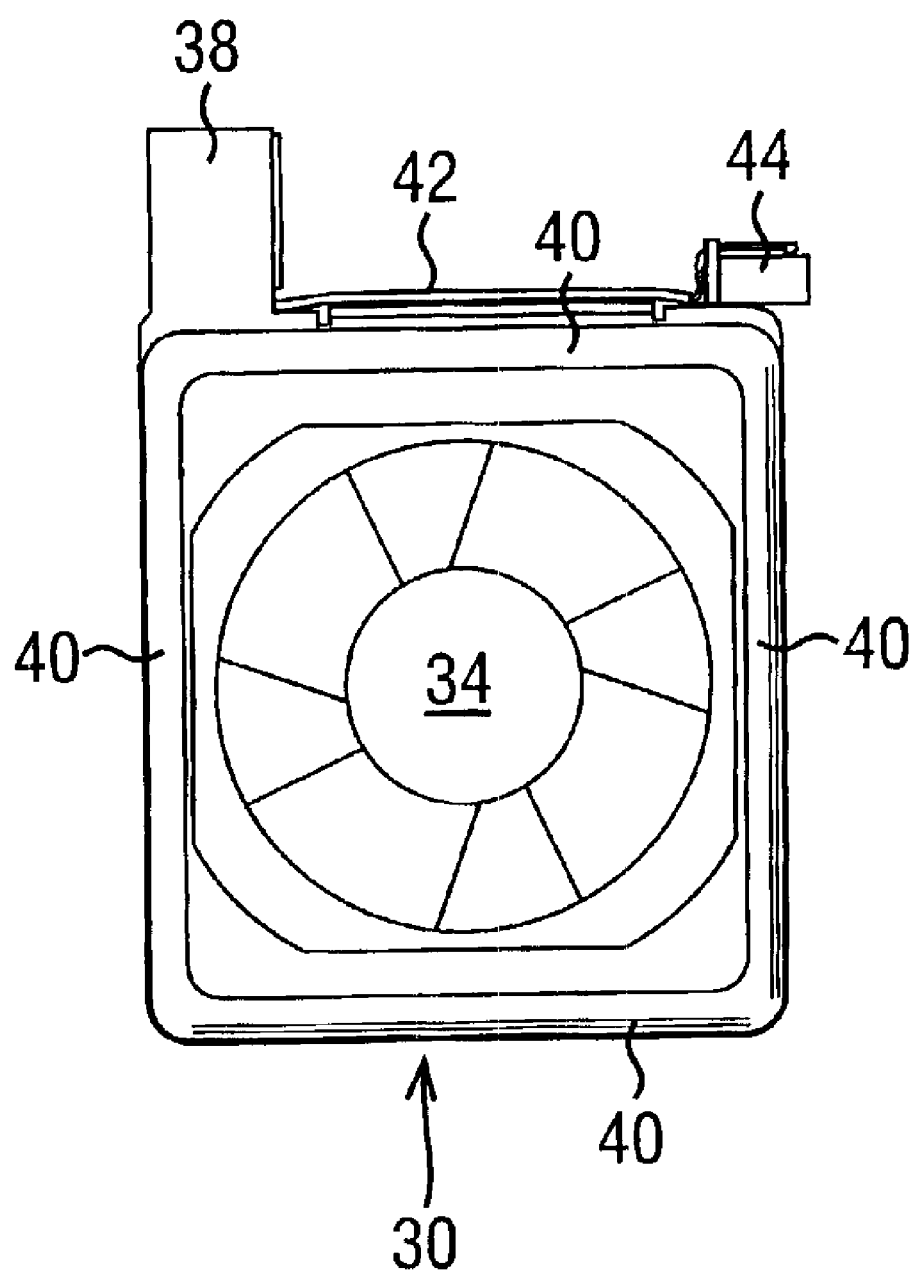
FIG. 6 is a view showing a fan module according to a modification of the invention.

A fan module according to a modification of the invention is shown in FIG. 6. This form of fan is the same as that shown in FIGS. 3 and 4, but, in this case, instead of forming a seal by means of one sheet 36 that engages a groove in the recess, a protuberance 40 is formed around the entire peripheral region of one face of the module. The protuberance 40 will simply contact either the internal face of the recess or the adjacent fan module 30 to form a seal against bypass leakage as soon as the module is inserted into the recess.

The scope of the present disclosure includes any novel feature or combination of features disclosed therein either explicitly or implicitly or any generalisation thereof irrespective of whether or not it relates to the claimed invention or mitigates any or all of the problems addressed by the present invention. The applicant hereby gives notice that new claims can be formulated to such features during prosecution of this application or of any such further application derived therefrom. In particular, with reference to the appended claims, features from dependent claims can be combined with those of the independent claims and features from respective independent claims can be combined in any appropriate manner and not merely in the specific combinations enumerated in the claims.

What is claimed is:

1. An electronics assembly which comprises a chassis having a recess therein for housing a plurality of cooling fans that are arranged in series and can be removed from the recess by sliding out of the recess in a direction across the direction of intended airflow, wherein any of the fans can be removed and replaced without interrupting operation of the or any other fan, and the recess and/or the fans have a seal to prevent or reduce bypass leakage of air around the fans, wherein one of the recess and the fans has a ridge that extend around at least a major part of the surface thereof that contacts the other of the recess and the fans, and the other of the recess and the fans has, extending around at least a major part of the corresponding surface thereof, a groove that receives the ridge to form at least part of the seal, and wherein the ridge and the groove extend around three sides of the fans and the recess.

2. An electronics assembly as claimed in claim 1, wherein the groove is located on the lowest side and is wider than the groove located on any other side.

3. An assembly as claimed in claim 1, wherein the ridge and the groove extend around sides of the fans and the recess other than a side from which the fans can be removed from the recess.

4. An assembly as claimed in claim 1, wherein the recess is in the form of a duct having a rectangular transverse cross-section.

5. An assembly as recited in claim 1, wherein any of the fans can be removed and replaced without the use of a tool.

6. An assembly as recited in claim 1, wherein the ridge is formed by a peripheral edge of a sheet that is attached to one face of the or each fan.

7. An assembly as recited in claim 1, wherein one of the recess and the fans has a protuberance that extends along at least part of the peripheral region thereof and which forms part of the seal.

8. An assembly as recited in claim 7, wherein the protuberance is located on the fans.

9. An assembly as recited in claim 8, wherein the protuberance is located on a major face of the fans and contacts another fan or an end surface of the recess.

10. An assembly as recited in claim 1, wherein each fan includes an element that can be grasped by a finger to enable the fan to be removed from the recess.

11. An assembly as recited in claim 10, wherein the element is formed as a loop extending between two sheets that are attached to each of the opposed major surfaces of the fan.

12. An assembly as recited in claim 1, wherein each fan has an electrical connector that can be connected to a corresponding connector on the chassis for providing power, and the fan cannot be removed from the recess without disconnecting the connectors.

13. An assembly as recited in claim 12, wherein the connector on the fan is connected thereto by means of wires that extend in front of a leading edge region of the fan to prevent removal thereof.

14. A chassis for an electronics assembly, which chassis has a recess therein for housing a plurality of cooling fans that can be inserted into the recess in a direction across the direction of intended airflow and arranged in the recess in series, wherein the chassis allows removal and replacement of any of the fans without interrupting operation of any of the other fans, and the recess has a seal which prevents or reduces bypass leakage of air around the fans, the seal bein in the form of a groove or a ridge that cooperates with a corresponding ridge or groove, respectively, on each of the fans and extends around three sides of the recess.

15. An electronics assembly which comprises a chassis having a recess therein for housing a plurality of cooling fans that are arranged in series and can be removed from the recess by sliding out of the recess in a direction across the direction of intended airflow, wherein any of the fans can be removed and replaced without interrupting operation of the or any other fan, and the recess and/or the fans have a seal to prevent or reduce bypass leakage of air around the fans, wherein the ridge is located on the fan or fans and the groove is located in the recess, and wherein the ridge is formed by the peripheral edge of a sheet that is attached to one face of the or each fan.

* * * * *

UNITED STATES PATENT AND TRADEMARK OFFICE
CERTIFICATE OF CORRECTION

PATENT NO. : 6,878,874 B2 Page 1 of 1
DATED : April 12, 2005
INVENTOR(S) : Osborn et al.

It is certified that error appears in the above-identified patent and that said Letters Patent is hereby corrected as shown below:

Column 8,
Line 17, please replace "bein" with -- being --.

Signed and Sealed this

Thirtieth Day of August, 2005

JON W. DUDAS
*Director of the United States Patent and Trademark Office*